(12) United States Patent
Tanaka

(10) Patent No.: US 6,559,390 B1
(45) Date of Patent: May 6, 2003

(54) SOLDER CONNECT ASSEMBLY AND METHOD OF CONNECTING A SEMICONDUCTOR PACKAGE AND A PRINTED WIRING BOARD

(75) Inventor: Kei Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/469,251

(22) Filed: Dec. 22, 1999

(30) Foreign Application Priority Data

Dec. 22, 1998 (JP) .............................................. 10-36554

(51) Int. Cl.[7] ................................................. H05K 1/16
(52) U.S. Cl. ........................ 174/260; 361/768; 361/770
(58) Field of Search ............................... 174/52.4, 52.2, 174/260; 361/767, 768, 770, 771

(56) References Cited

U.S. PATENT DOCUMENTS

| 4,871,921 A | 10/1989 | Gurnee |
| 5,641,113 A | 6/1997 | Somaki et al. |
| 5,666,270 A | 9/1997 | Matsuda et al. |
| 5,821,456 A | * 10/1998 | Wille et al. ................. 174/52.2 |
| 5,867,368 A | * 2/1999 | Glenn ......................... 361/783 |
| 6,034,333 A | * 3/2000 | Skipor et al. ............... 174/260 |
| 6,228,468 B1 | * 5/2001 | Vodrahlli .................... 428/210 |
| 6,248,951 B1 | * 6/2001 | Murali et al. ............... 174/52.2 |

FOREIGN PATENT DOCUMENTS

| EP | 0 189 791 | 8/1986 |
| EP | 0 831 525 | 3/1998 |
| JP | 8-116169 | 5/1996 |
| JP | 9-167890 | 6/1997 |
| JP | 10-116856 | 5/1998 |
| JP | 10-313016 | 11/1998 |

* cited by examiner

Primary Examiner—Kainard Cuneo
Assistant Examiner—José H. Alcala'
(74) Attorney, Agent, or Firm—Sughrue Mion, PLLC

(57) ABSTRACT

A solder connecter assembly having a printed wiring board, an electrode formed on the printed wiring board, a semiconductor package, a pad formed on the semiconductor package, a resist formed on the printed wiring board and having an opening of the resist around the electrode, a solder ball disposed between the electrode and the pad, and a resin fillet formed in the opening and in a vicinity of a connecting part between the solder ball and the electrode.

5 Claims, 4 Drawing Sheets

SOLDER CONNECT ASSEMBLY AND METHOD OF CONNECTING A SEMICONDUCTOR PACKAGE AND A PRINTED WIRING BOARD

BACKGROUND OF THE INVENTION

1. Field of the Invention

The present invention relates to a solder connect assembly and a method of connecting a semiconductor package and a printed wiring board, and in particular to a solder connect assembly and a method of connecting a semiconductor package and a printed wiring board for electrically and mechanically connecting a semiconductor package and a printed wiring board through a plurality of solder balls.

2. Description of the Related Art

This kind of a conventional solder connect assembly is disclosed in Japanese Patent Application Laid-Open No. Hei 10-116856. As shown in FIG. 1, in the conventional solder connect assembly, in LSI chip 11 is connected and mounted to/on a ceramic board 12 via solder balls 30 which are external terminals of the LSI chip 11. Also, the ceramic board 12 is similarly connected and mounted to/on a printed wiring board 20 via the solder balls 40 which is an external terminal of the ceramic board 12. After the ceramic board 12 and the printed wiring board 20 are connected via the solder balls 40, clearance between the ceramic board 12 and the printed wiring board 20 is filled with underfiling resin 90.

However, in the conventional solder connect assembly, as the clearance between the ceramic board 12 and the printed wiring beard 20 is filled with underfiling resin 90, there is a problem that the ceramic board 12 cannot be replaced or repaired in case a problem occurs in the ceramic board 12 or the LSI chip 11 after the underfiling resin 90 is cured.

Also, while the underfiling resin 90 is filled utilizing a capillary phenomenon, in the conventional solder connect assembly, there is a problem that a void often occurs in the vicinity of an interface between the solder balls 40 and the printed wiring board 20. When stress is applied to the underfiling resin 90 after its curing, the stress is not reduced enough and the solder balls 40 may be broken.

Further, there is a problem that the solder balls 40 may be broken due to the storage and carriage of the solder balls 40 and stress by heating when the underfiling resin 90 is cured in a process till the filling and curing of the underfiling resin 90.

In addition, in Japanese Patent Application Laid-open No. Hei 8-116169, another conventional solder connect assembly is disclosed.

The conventional solder connect assembly provides a fatigue resistant solder connection for a solder connection structure. The solder connection structure, which couples the facing surfaces of two substrates, is comprised of a compliant metal alloy solder preform connectably disposed between two less compliant metal alloy solder fillets.

Further, an underfiling resin and a resin fillet in a conventional electric device assembly are disclosed in Japanese Application Laid-Open No. Hei 9-167890 and Hei 10-313016, respectively. However, it is not taught in these references that an assembly electrically and mechanically connects a plurality of solder balls and a printed wiring board.

SUMMARY OF THE INVENTION

It is therefore an object of the present invention to provide a solder connect assembly and a method of connection capable of enhancing reliability in connection of a solder ball connection.

Another object of the present invention is to provide a solder connect assembly and a method of connection capable of replacing a package or a board for repairing it after connection thereof.

In order to achieve the above objects, a solder connect assembly according to the present invention comprises a printed wiring board, a semiconductor package, a plurality of solder balls disposed between the printed wiring board and the semiconductor package, for connecting the printed wiring board and said semiconductor package, and a resin fillet formed in the vicinity of the printed wiring board and each said solder ball.

Another solder connect assembly according to the present invention comprises a printed wiring board, a electrode formed on the printed wiring board, a semiconductor package, a pad formed on the semiconductor package, a solder ball disposed between the electrode and the pad, and a resin fillet formed on a side of the solder ball.

In order to achieve the above objects, a method of connecting a semiconductor package and a printed wiring board according to the present invention comprises the steps of supplying cream solder on an electrode formed on the printed wiring board, wherein the cream solder includes resin, mounting the semiconductor package on the printed wiring board, heating and melting the cream solder, and cooling and curing the cream solder, thereby a solder ball is formed between the semiconductor package and the printed wiring board.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Figure 1:
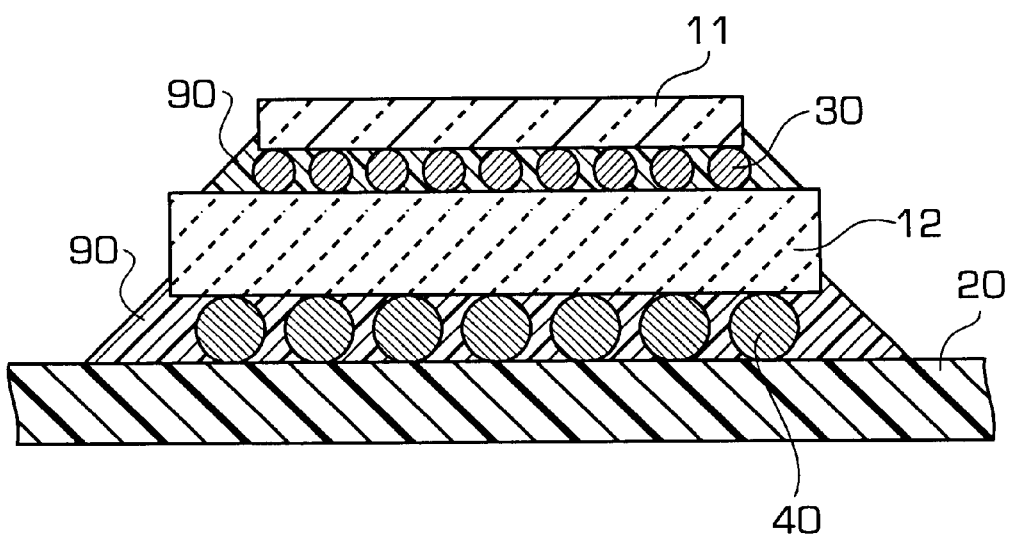
FIG. 1 is a sectional view showing a conventional solder connect assembly.

Referring to the drawings, preferred embodiments according to the present invention will be described in detail below.

1. First Embodiment

Figure 2:
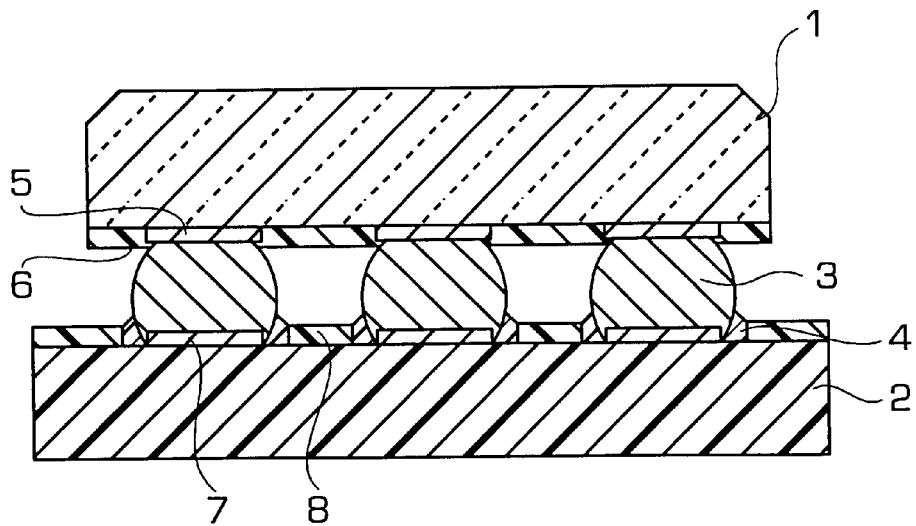
FIG. 2 is a sectional view showing a first embodiment of a solder connect assembly according to the present invention.

As shown in FIG. 2, a semiconductor package 1 and a printed wiring board 2 are electrically and mechanically connected via plural solder balls 3. The vicinity of a connection between the solder balls 3 and the printed wiring board 2 is covered with the resin fillet 4.

Figure 3:
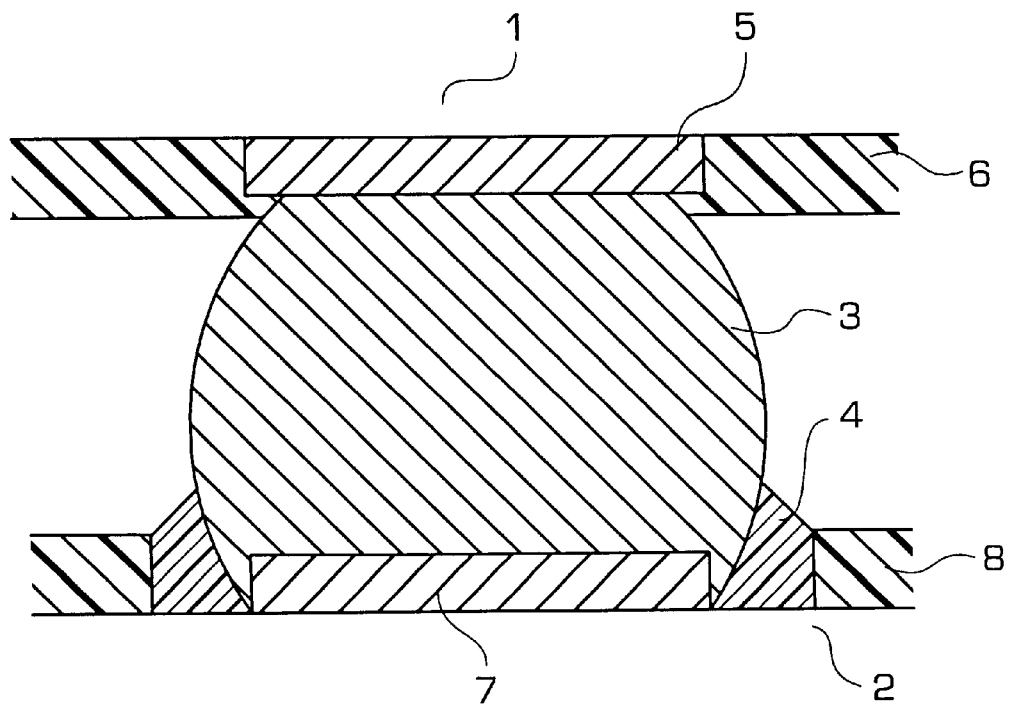
FIG. 3 is an enlarged sectional view for explaining the solder connect assembly shown in FIG. 2.

A plurality of pads 5 are formed on one side of the semiconductor package 1 as external terminals with respect to the printed wiring board 2. The shape of each pad 5 is determined by a solder resist 6. A plurality of electrodes 7 are formed on the component mounting side of the printed wiring board 2. The pad 5 and the electrode 7 respectively opposite are connected via the solder ball 3. The solder resists 8 are formed on the printed wiring board 2 so that the opening is formed by the solder resist 8 and electrode 7. The resin fillets 4 are formed so that they cover parts formed by both of the solder balls 3 and the opening by the solder resists 8. Each resin fillet 4 is slightly expanded on the side of the solder ball 3 as shown in FIG. 3.

The first embodiment of the solder connect assembly shown in FIGS. 2 and 3 will be described in detail below. The plural pads 5 as external terminals are formed on one side of the semiconductor package 1. They normally have structure called a ball grid array (BGA) or a chip-sized package (CSP). The internal configuration of the semiconductor package 1 is not particularly limited and for the internal connecting method, a package according to various methods such as wire bonding connecting method, a flip-chip mounting method and a TAB connecting method can be also applied.

The end of each pad 5 on the semiconductor package 1 is covered with the solder resist 6. The shape of each pad 5 is determined by the shape of the opening of the solder resist 6.

In the meantime, as the printed wiring board 2 is made of glass epoxy, a plurality of electrodes 7 are formed on the component mounting side of the printed wiring board 2. The surface of the printed wiring board 2 is covered with the colder resist 8 and the periphery of the electrode 7 is open so that the electrode 7 is not covered with the solder resist 8. The pads 5 and the electrodes 7 are connected via the solder balls 3. The sectional shape of the solder ball 3 is a barrel shape.

The resin fillets 4 are formed so that they cover parts formed by both of the solder balls 3 and the opening of the solder resist 8 on the side of the printed wiring board 2 and is slightly expanded on the side of the solder balls 3. The resin fillets 4 are mainly made of rosin or a reactant of rosin. For an example of the resin fillets 4, a resin fillet mainly made of a reactant of abietic acid such as neoabietic acid and pyroabietic acid can be given.

In the method of connecting a solder connect assembly of the first embodiment, cream solder is supplied on the electrode 7 of the printed wiring board 2 by a printing method. The cream solder is supplied in the same shape as the electrode 7 on the printed wiring board 2. The used cream solder includes rosin which is the major component of the resin fillets 4. Next, the semiconductor package 1 is positioned by the component mounting machine provided with the image recognition device and is mounted on the printed wiring board 2. Further, rosin coheres in the vicinity of a connection between the solder balls 3 and the printed wiring board 2 by cooling and solidifying cream solder after melting it by reflow. As a result, the solder connect assembly shown in FIGS. 2 and 3 wherein the resin fillets 4 are formed in the vicinity of a connection between the solder ball 3 and the printed wiring board 2, is acquired.

As described above, according to the first embodiment, the following effect is produced.

The first effect of the present invention is that the reliability in connection of the solder ball connection can be enhanced. In addition, even if a problem occurs in the semiconductor package 1, the semiconductor package 1 can be replaced for repairing.

The reason is that reliability in connection can be enhanced because stress applied to a part at the base of the solder balls 3 due to mechanical shock and/or thermal change is dispersed by the resin fillets 4 formed at the foot of the solder balls 3 with respect to the printed wiring board 2 and as a result, stress does not concentrate at the part at the base of the solder ball 3. Further, the reason is that the package can be replaced because the semiconductor package 1 can be detached by melting the solder balls 3.

The second effect is that the diameter of the electrode 7 on the side of the printed wiring board 2 can be reduced in contrast to the conventional solder connect assembly. Hereby, the width of a wire and the width of clearance between wires can be increased in case the electrodes 7 are wired and in other cases when the surface wiring of the printed wiring board 2 is formed and the manufacture of the printed wiring board 2 is facilitated. As a result, the printed wiring board 2 the yield and the quality of which are high and the cost of which is low can be used.

In case the package is normally connected to the printed wiring board via the solder balls, stress is not applied to either of the package or the printed wiring board by equalizing the diameter of the pad 5 of the package 1 and that of the electrode 7 of the printed wiring board 2. In contrast, the present invention can make the diameter of the electrode 7 smaller than that of the package 5, because stress applied at the base of the solder ball 3 with respect to the electrode 7 is reduced.

The third effect is that stress is reduced by the resin fillets 4 on the side of the printed wiring board 2 of the solder ball connection and reliability in connection higher than that in a conventional type can be acquired even if the diameter of the electrode 7 is smaller than that of the electrode in the conventional solder connect assembly.

The fourth effect is that the connection by the solder balls can be prevented from being broken in a process for storage and carriage until the clearance between the package 1 and the printed wiring board 2 is finally filled with the underfiling resin 9 and the resin is cured, in an supplying resin process and in a underfiling resin curing process. The reason is the same as the reason in the first effect.

2. Second Embodiment

Figure 4:
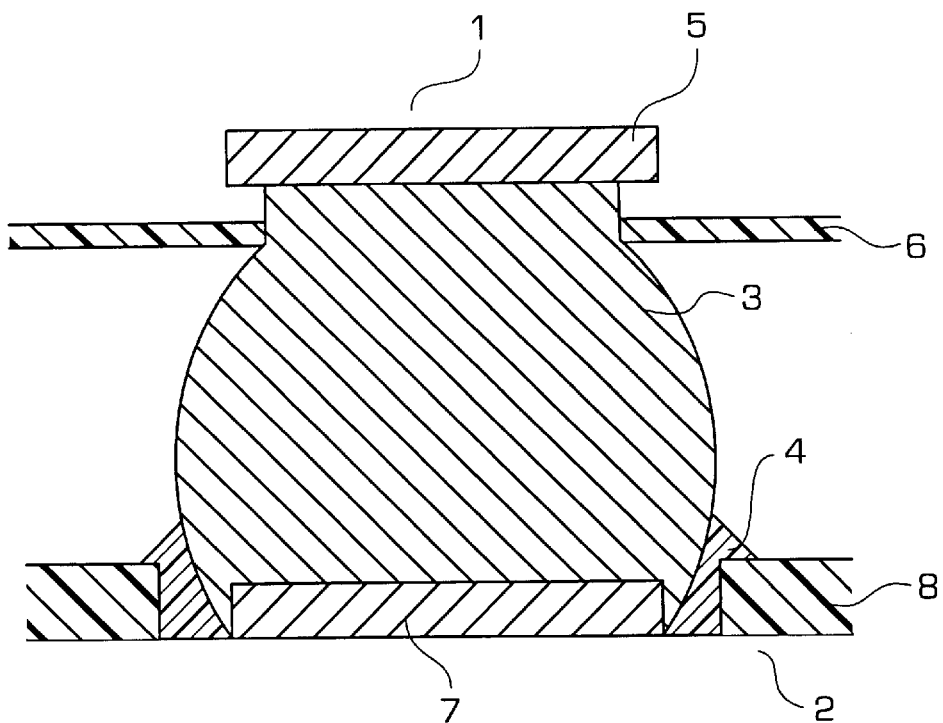
FIG. 4 is an enlarged sectional view showing a second embodiment of a solder connect assembly according to the present invention.

In this embodiment, the resin fillets 4 are expanded to the end of the upper surface of a solder resist 8 with respect to the printed wiring board 2 as shown in FIG. 4. The shape of the solder balls 3 may be also except a barrel shape and is a cylindrical shape which is slightly thinner at the upper end of the solder balls 3 with respect to the printed wiring board 2 as shown in FIG. 4.

In the first embodiment, a printed wiring board 2 is made of glass epoxy, however, the material is not limited to glass epoxy, and a ceramic board, a glass ceramic board, a flexible board, a thin film board and others can be also applied. For the solder balls 3, eutectic solder composed of Sn and Pb is normally used, however, the solder balls 3 is not limited to the above solder and solder including tin (Sn) or lead (Pb) and Pb-free solder can be also applied. In the second embodiment, the same effect as the effect in the first embodiment is also acquired.

3. Third Embodiment

Figure 5:
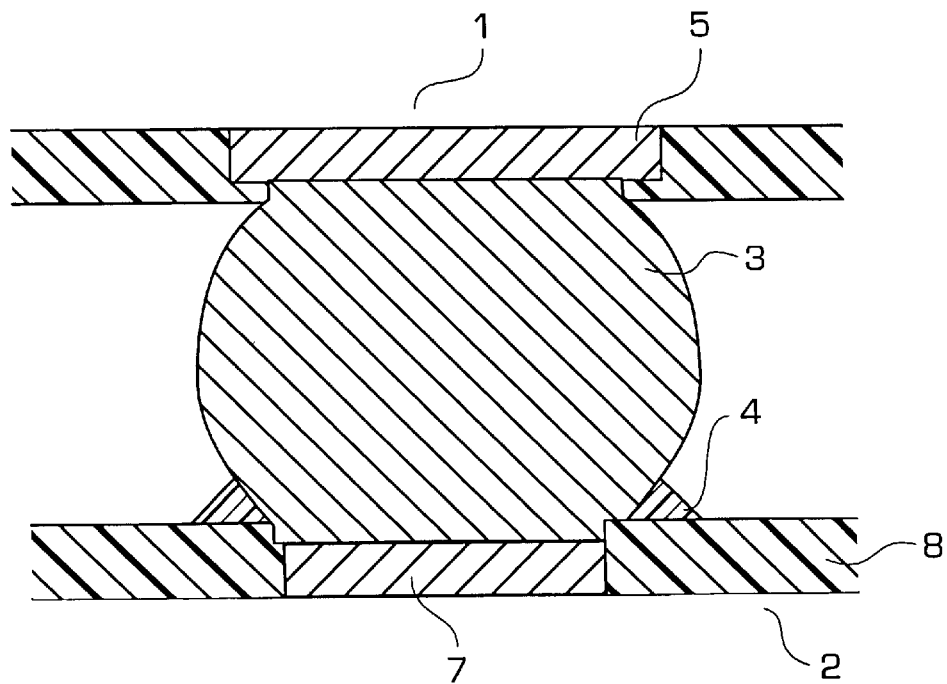
FIG. 5 is an enlarged sectional view showing a third embodiment of a solder connect assembly according to the present invention.

In this embodiment, a solder resist 8 covers the end of an electrode 7 as shown in FIG. 5 and the shape of the electrode 7 is determined based upon the shape of the opening of the solder resist 8. A resin fillet 4 is formed on the solder resist 8. In this case, the same effect as the effect in the first embodiment is also acquired.

It is clear that the shape that the side of the semiconductor package 1 is slightly thinner of the solder ball 3 shown in the second embodiment can be applied to the first and third embodiments.

In the third embodiment, a printed wiring board 2 is made of glass epoxy, however, the material is not limited to glass epoxy, and a ceramic board, a glass ceramic board, a flexible board, a thin film board and others can be also applied. For the solder ball 3, eutectic solder composed of Sn and Pb is normally used, however, the solder ball it not limited to the above solder and solder including Sn or Pb and Pb-free solder can be also applied.

Further, the resin fillet 4 is also not limited to rosin and epoxy resin or a reactant of epoxy resin may be also a major component. For an example of the resin fillet 4 composed of epoxy resin, a resin fillet mainly made of a reactant of mixture of bisphenol A and dicarboxylic acid can be given. This embodiment produces effect that if epoxy resin or a reactant of epoxy resin is a major component, the elastic modulus of the resin fillet 4 itself is lower than that in the first embodiment, the resin fillet has flexibility, even if stress is applied to the resin fillet, a crack is hardly made in the resin fillet 4 and as a result, resistance to stress is further enhanced.

4. Fourth Embodiment

Figure 6:
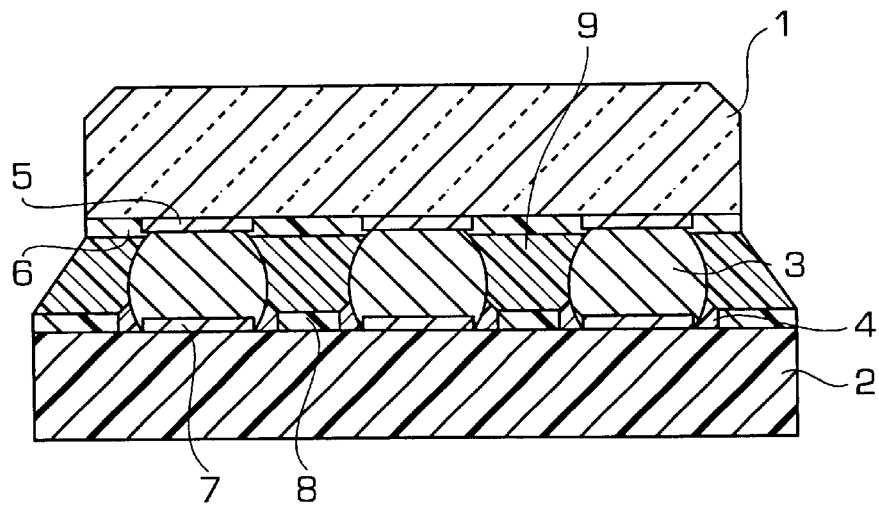
FIG. 6 is an enlarged sectional view showing a fourth embodiment of a solder connect assembly according to the present invention.

In the fourth embodiment, clearance between a semiconductor package 1 and a printed wiring board 2 is filled with underfiling resin 9 as shown in FIG. 6. The fourth embodiment produces effect that as stress applied to a solder ball 3 can be further more reduced, compared with the case in the first embodiment, resistance to stress is further enhanced. It is clear that in the fourth embodiment, the shape of the solder ball 3 and the resin fillet 4 respectively shown in FIGS. 2 to 4 in the first embodiment can be also applied.

5. Fifth Embodiment

Figure 7:
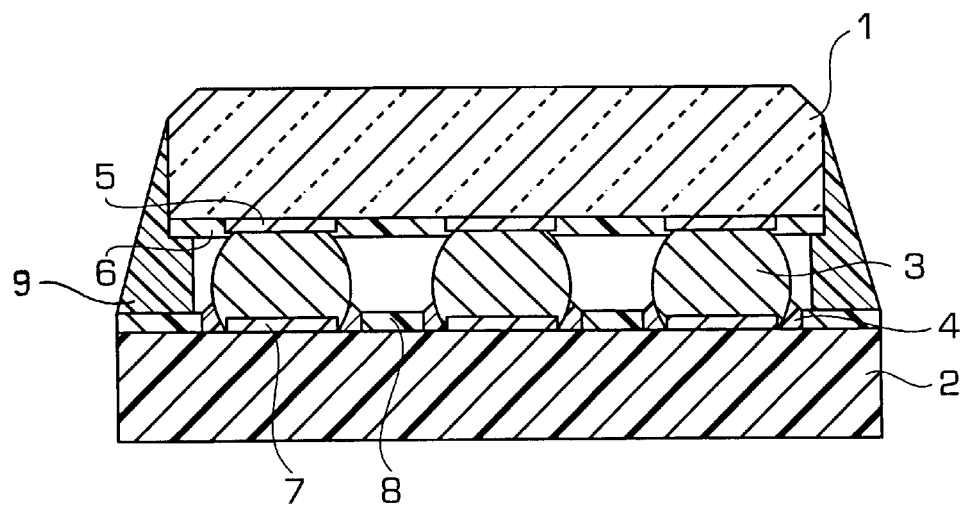
FIG. 7 is a sectional view showing a fifth embodiment of a solder connect assembly according to the present invention.

In this embodiment, the whole clearance between a semiconductor package 1 and a printed wiring board 2 is not filled with underfiling resin 9 but only the end of the semiconductor package 1 is fixed by underfiling resin 9 as shown in FIG. 7. The fifth embodiment produces effect that stress applied to a solder ball 3 can be further reduced, compared with the case in the first embodiment, resistance to stress is further enhanced and a method of manufacturing solder connect assembly is also simpler than that in the fourth embodiment.

It is clear that in the fifth embodiment, the shape of the solder ball 3 and the resin fillet 4 respectively shown in FIGS. 2 to 4 in the first embodiment can be also applied.

It is clear that the present invention is not limited to the above embodiments and the above embodiments can be suitably changed within a range of the technical idea of the present invention. The number, the position, the shape and others of the above members are not limited to those in the above embodiments, and the number, the position, the shape and others suitable for embodying the present invention can be selected. In each drawing, the same reference number is allocated to the same component.

The invention may be embodied in other specific forms without departing from the spirit or essential characteristics thereof. The present invention embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A solder connecter assembly comprising:
   a printed wiring board;
   an electrode formed on said printed wiring board;
   a semiconductor package;
   a pad formed on said semiconductor package;
   a resist formed on said printed wiring board and having an opening of said resist around said electrode;
   a solder ball disposed between said electrode and said pad; and
   a resin fillet formed in said opening and in a vicinity of a connecting part between said solder ball and said electrode.

2. The solder connect assembly as claimed in claim 1, wherein said resin fillet is formed between said solder ball and said resist.

3. The solder connect assembly as claimed in claim 2, wherein said resin fillet is directly formed on said printed wiring board.

4. The solder connect assembly as claimed in claim 1, wherein the end of said electrode is covered with said resist, whereby a shape of said electrode is determined.

5. The solder connect assembly as claimed in claim 4, wherein said resin fillet is formed on said resist, without directly connecting said printed wiring board.

* * * * *

UNITED STATES PATENT AND TRADEMARK OFFICE
CERTIFICATE OF CORRECTION

PATENT NO. : 6,559,390 B1 Page 1 of 1
DATED : May 6, 2003
INVENTOR(S) : Kei Tanaka It is certified that error appears in the above-identified patent and that said Letters Patent is hereby corrected as shown below:

<u>Title page,</u>
Item [30], Foreign Application Priority Data, please delete "10-36554" insert -- 10-365547 --

Signed and Sealed this

Twenty-third Day of September, 2003

JAMES E. ROGAN
*Director of the United States Patent and Trademark Office*